United States Patent [19]
Denheyer et al.

[11] Patent Number: 5,642,378
[45] Date of Patent: Jun. 24, 1997

[54] DUAL MODE ANALOG AND DIGITAL CELLULAR PHONE

[76] Inventors: Brian John Denheyer, 7845 SE. 36th Ave., Portland, Oreg. 97202; John David Terry, 745 16th St., NE., Salem, Oreg. 97301

[21] Appl. No.: 341,400

[22] Filed: Nov. 17, 1994

[51] Int. Cl.[6] .................................................. H04L 27/00
[52] U.S. Cl. ........................ 375/216; 375/219; 379/59
[58] Field of Search .................................. 375/216, 219, 375/261; 379/58, 59; 455/33.1; 332/103; 329/304

[56] References Cited

U.S. PATENT DOCUMENTS

| | | |
|---|---|---|
| 4,523,155 | 6/1985 | Walczak et al. ................ 330/279 |
| 4,682,123 | 7/1987 | Loper et al. .................... 375/216 |
| 4,885,798 | 12/1989 | Junich et al. ..................... 455/52 |
| 4,914,651 | 4/1990 | Lusignan ....................... 370/69.1 |
| 5,119,397 | 6/1992 | Dahlin et al. ...................... 375/5 |
| 5,128,692 | 7/1992 | Trinh ............................. 330/129 |
| 5,175,871 | 12/1992 | Kunkwl ............................ 455/69 |
| 5,193,223 | 3/1993 | Walczak et al. ................ 455/115 |
| 5,204,608 | 4/1993 | Koenck ............................. 320/2 |
| 5,218,284 | 6/1993 | Burns et al. ..................... 320/14 |
| 5,228,074 | 7/1993 | Mizikovsky ...................... 379/59 |
| 5,267,262 | 11/1993 | Wheatley, III ..................... 375/1 |
| 5,282,226 | 1/1994 | Critchlow ........................ 375/59 |
| 5,283,815 | 2/1994 | Chennakeshu .................. 375/84 |
| 5,287,555 | 2/1994 | Wilson et al. .................. 455/115 |
| 5,446,422 | 8/1995 | Mattila et al. .................. 375/216 |
| 5,448,555 | 9/1995 | Bremer et al. .................. 375/261 |

*Primary Examiner*—Stephen Chin
*Assistant Examiner*—T. Ghebretinsae
*Attorney, Agent, or Firm*—Chernoff, Vilhauer, McClung & Stenzel

[57] ABSTRACT

A dual mode cellular telephone contains modulator and demodulator circuitry that use the same I and Q signals for processing both analog and digital voice data. A power amplifier (PA) bias voltage is varied in coordination with the phone operating mode and geographical location to increase energy efficiency. The power supply for the PA is controlled in combination with a controlled ramp up and ramp down of the modulated I and Q signals to eliminate "spectral splatter" of the transmission band into adjacent frequencies. A variable gain amplifier is coupled to the front end of the phone receiver circuitry to increase the overall dynamic range for the gain of the demodulated I and Q signals. A switching power supply is used in the dual mode phone to increase energy efficiency and reduce the required size of the battery pack.

34 Claims, 13 Drawing Sheets

DUAL MODE ANALOG AND DIGITAL CELLULAR PHONE

BACKGROUND OF THE INVENTION

This invention relates generally to portable cellular phones and more particularly to a dual mode phone that can transmit and receive both analog and digital telecommunication data.

Many cellular telephones are designed to receive and transmit both analog and digital signals. FIG. 1 is a prior art schematic diagram showing typical circuitry for performing both analog and digital telephonic communications.

When transmitting digital data in a typical cellular telephone, in phase (I) and quadrature phase (Q) signals are fed from a digital signal processor (DSP) 10 into an IQ modulator 12. The I and Q signals modulate a local oscillator signal (LO) 21. The modulated I and Q signals are then passed through a power amplifier 16 and transmitted from an antenna 20.

For analog transmissions, a frequency modulated (FM) voice signal is output from an analog FM circuit 22 and modulates the LO. The modulated analog signal is amplified by power amplifier 16 and then transmitted from antenna 20. Thus, during transmission of digital data the analog transmitter circuitry (22, 26) is not used and during transmission of analog data the digital transmitter circuitry (12) is not used.

For receiving signals, the antenna 20 receives radio frequency (RF) signals either encoded in analog or digital formats. The RF signal from antenna 20 is mixed down to a lower intermediate frequency (IF) at mixer 30. For analog signals, a discriminator 34 extracts the FM signal and feeds the result back to the FM analog circuit 22.

The discriminator 34 extracts a baseband signal from the received FM input. The amplitude (A) and phase ($\phi$) of the RF signal are then extracted from the baseband signal. The I and Q signals are then generated according to the relationship, $A\cos\phi + jA\sin\phi$, wherein $I = A\cos\phi$ and $Q = A\sin\phi$. Alternatively, a separate IQ demodulator 32 is used to process digital RF data.

The system shown in FIG. 1 utilizes separate circuitry for transmitting and receiving digital and analog data. For example, in the transmit portion of the cellular phone, the IQ modulator 12 is used for modulating digital data and the FM modulator 26 are used for modulating analog data. On the receiver side of the dual mode cellular phone, the discriminator 34 is used for demodulating analog data and additional circuitry is utilized to translate the discriminator data into a digital format. Alternatively, a separate IQ demodulator 32 is used to demodulate digital signals.

U.S. Pat. No. 5,228,074 to Mizikovsky shows a dual mode analog and digital phone that uses separate DQPSK demodulator circuitry 29 for decoding digital voice signals. Analog voice signals are received and demodulated by a separate FM demodulator 18. Multiple switches are moved back and forth depending upon the transmit and receive modes of the cellular phone (i.e., analog or digital). The separate circuitry used in Mizikovsky and in FIG. 1 for processing both analog and digital data increase phone complexity and cost while reducing system reliability.

Another problem with the standard FM modulation and demodulation schemes described above is that precise frequency tuning is required to accurately process the voice signals at the correct modulation frequencies and gain values. Small variations or inconsistencies in signal tuning distort the sound quality of transmitted and received voice signals. Thus, it would be desirable to utilize as much digital circuitry as possible to process voice signals.

Dual mode phone systems must operate according to industry standard IS-54B for 800 MegaHertz (MHz) signal transmissions. Complex phone circuitry and large power sources are required to implement the IS-54B standard. However, consumer demand requires that cellular phones be inexpensive, small, light weight and operate for long periods of time on relatively small battery packs.

Accordingly, a need remains for a simple low cost dual mode analog and digital cellular telephone that is inexpensive and can operate on a small portable power supply for long periods of time.

SUMMARY OF THE INVENTION

A dual mode cellular telephone contains transmitter and receiver circuitry uses a single IQ modulator and a single IQ demodulator for transmission and reception of both analog and digital voice data. Thus, much of the circuitry previously used for separately modulating and demodulating analog and digital data is eliminated. For example, in FIG. 1, the FM modulation circuit 26 and the discriminator circuit 34 are no longer needed for transmitting and receiving voice data respectively. Thus, circuitry for the dual mode phone is simplified and less expensive to build.

A linear power amplifier (PA) is used in a transmit mode for transmitting analog and digital voice data. In the PA, there is usually a fixed bias voltage. When the output power level for a transmission sequence is lowered, the bias voltage of the PA normally remains constant. However, the normal operating bias level of the PA is not needed for many transmission power levels. Thus, the bias voltage of the PA is controlled in coordination with the required output power level to increase energy efficiency and extend battery life.

In another aspect of the transmitter circuitry, a PA control circuit is used in combination with a controlled ramp up and ramp down of the modulated I and Q signals to eliminate "spectral splatter" of the phone transmission band into adjacent frequencies. The PA control circuit increases reliability and allows the dual mode phone to meet the IS-54B standard with minimal hardware investment.

In still another aspect of the invention, a variable gain amplifier is coupled to the phone receiver circuitry to increase the overall dynamic range of the receive chain. The amplifier is operated in a controlled manner in conjunction with a second variable gain amplifier to prevent distortion in the I and Q signals.

In still another aspect of the invention, a switching power supply is used in combination with the phone transmit and receive circuitry to increase energy efficiency while permitting a reduction in overall size of the phone battery pack. The switching power supply generates a second voltage above a given battery voltage only during transmit modes and only for selected circuitry operating at higher voltage levels.

The foregoing and other objects, features and advantages of the invention will become more readily apparent from the following detailed description of a preferred embodiment of the invention which proceeds with reference to the accompanying drawings.

DETAILED DESCRIPTION

Analog and Digital Processing Using IQ Modulation

Figure 1:
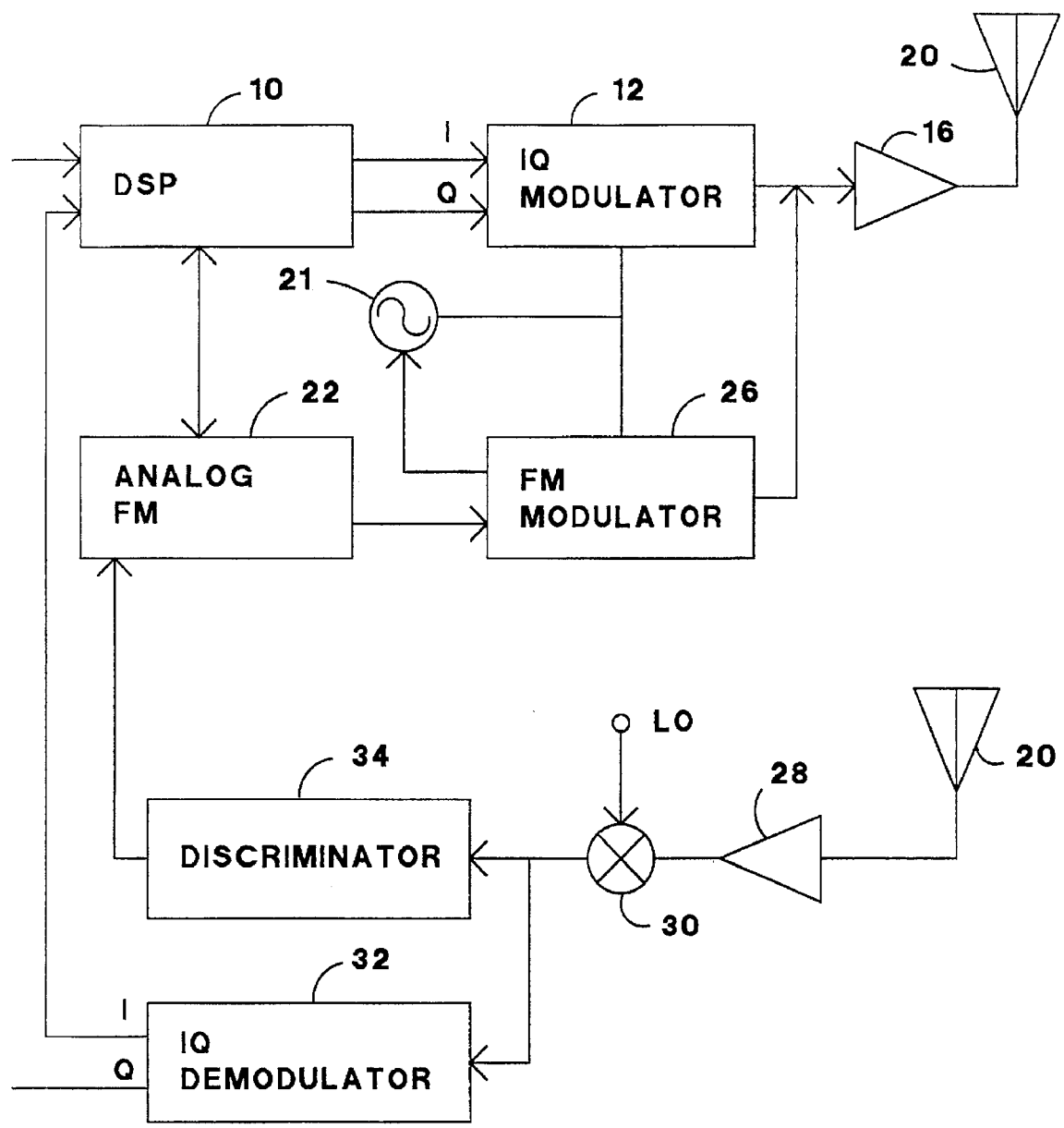
FIG. 1 is a prior art schematic diagram for a dual mode analog and digital cellular phone.
Figure 2:
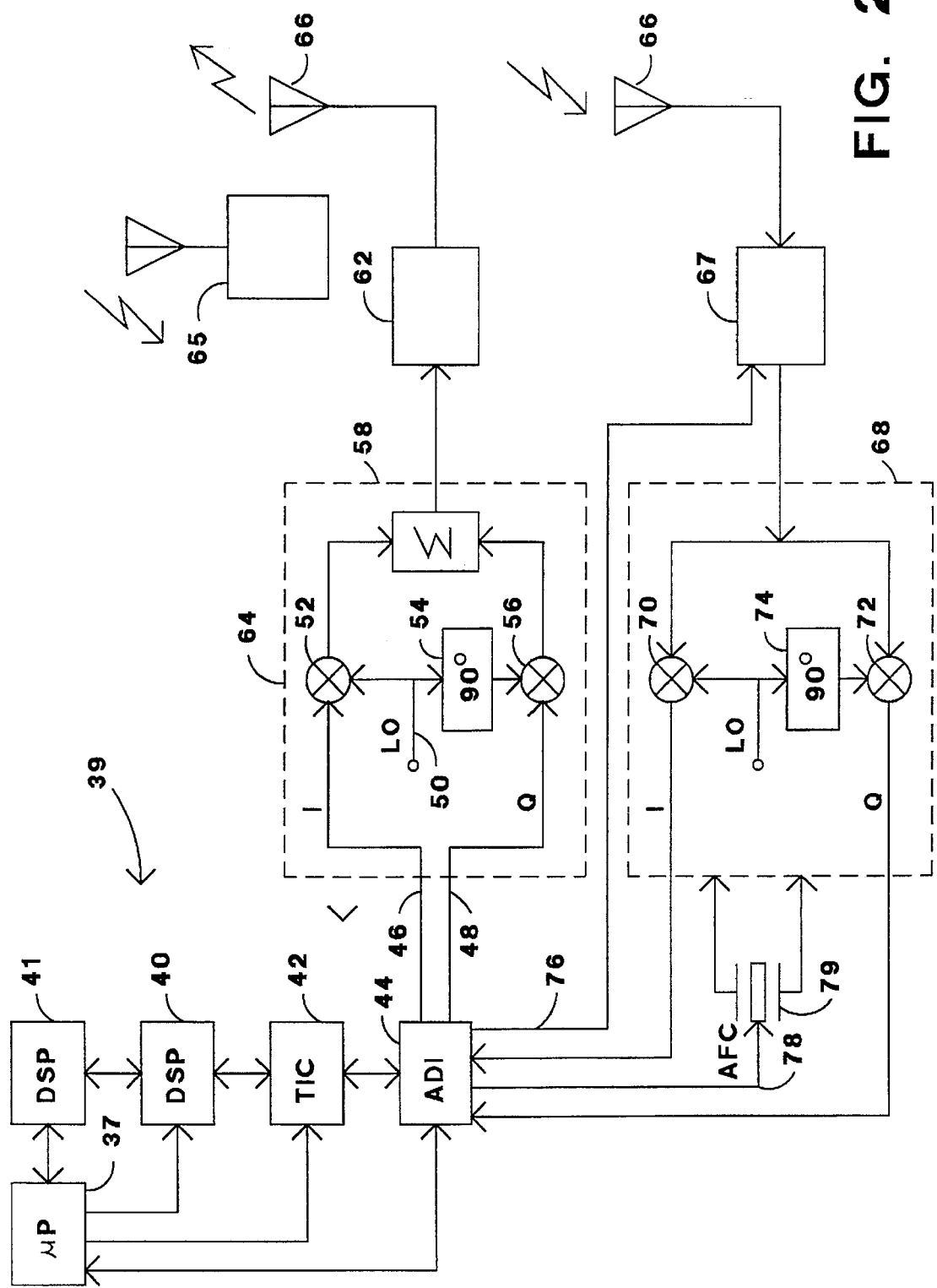
FIG. 2 is a schematic diagram of a dual mode analog and digital cellular phone according to the invention.

FIG. 2 is a schematic diagram of a dual mode cellular phone according to the present invention. A digital signal processor (DSP) 40 is coupled between a voice processing chip 41 and a timing interface controller (TIC) 42. The TIC sends and receives signals to an analog to digital interface chip (ADI) 44 which sends and receives I and Q signals to both an IQ modulator circuit 64 and a IQ demodulator circuit 68.

The DSP's 41 and 40, TIC 42, ADI 44 and any additional digital circuitry utilized to process, store, and control the various voice data is controlled in general by a microprocessor 37. For clarity of description, all the digital circuitry including the DSP's TIC, ADI, and CPU are hereinafter referred to generally as central processing unit 39. All the components in the CPU 39 are commercial IC's known to those skilled in the art and are, therefore, not described in detail.

The ADI 44 transmits I and Q signals to modulator 64. The I and Q signals can interchangeably represent either analog or digitally encoded voice data. A local oscillator (LO) signal 50 is modulated with the I signal in mixer 52. The LO signal is phase shifted by 90 degrees in phase shifter 54 before being modulated with the Q signal in mixer 56. The modulated I and Q signals are summed together in summing circuit 58 and further processed in transmitter circuitry 62 before being transmitted as an FM signal from antenna 66.

The receiver circuitry receives an RF signal on antenna 66 and performs front end receiver processing in receiver circuitry 67 before passing the signal onto IQ demodulator 68. The IQ demodulator 68 includes a mixer 70 that receives the RF signal and a LO signal and generates the in phase signal (I). A mixer 72 receives a 90 degree phase shifted LO signal from a phase shifter 74 and the RF signal from transmitter circuitry 67 and generates the quadrature phase signal (Q). An automatic gain control line 76 is coupled to the receiver chain and an automatic frequency control line 78 is coupled from the ADI to a temperature controlled reference oscillator (TCXO) 79.

The dual mode phone transmits voice data to a cellular base station 65 which then relays the message to an appropriate receiver. The dual mode phone then receives FM voice messages from a cellular base station located in the same relative geographical location. It is important to note that the system shown in FIG. 2 can be used in any wireless dual mode transmission system. Thus, while this description discusses specifically voice communication, it is understood that other kinds of signals can be transmitted in a similar manner.

The I and Q signals are the same signal out of phase by 90 degrees. For example, if I and Q are pure sine waves, I and Q can be represented as follows; $I(t)=\cos \omega_c t$ and $Q(t)=\sin \omega_m t$, where $\omega$ is the frequency component and t is a time component of the I and Q signals. The analog FM signal is then derived from the I and Q components according to the equation $FM(t)=A\cos(\omega_c t + K_f \cos \omega_m t)$, where A and $K_f$ are amplitude coefficients for the sine and cosine terms of the FM signal.

The I and Q signals are generated in a given format so that the output of modulator 64 an FM signal. The IS-54B standard published by the Electronic Industry Association/ Telecommunications Industry Association, 2001 Pennsylvania Avenue N.W., Washington, D.C. 20006, describes in detail the method for digitally encoding and decoding analog and digital signals according to I and Q values and is herein incorporated by reference.

The receiver circuitry correspondingly translates an RF signal from antenna 66 into the I and Q signals at the I and Q outputs of demodulator 68. After initial filtering and signal amplification in receiver circuitry 67, the LO signal is mixed with the voice data in demodulator 68 generating the demodulated I and Q signals. The CPU 39 is notified by the base station 65 whether the RF signal was transmitted in an analog or digital mode.

The CPU 39 then decodes the I and Q signals according to the transmission format (analog or digital) and outputs the decoded signal to a microphone (not shown). The message protocol for identifying both analog and digital transmissions between a cellular phone and a cellular base station is contained in the IS-54 standard and is, therefore, not described in detail.

For example, if an analog signal is transmitted by base station 65, the I and Q signals are reconstructed into an analog signal according to the value of FM(t) described above. The analog data is then output from the phone speaker. Alternatively, if digital data is transmitted, the I and Q signals are transposed into a digital data stream and further decoded in CPU 39. The digital data is then synthesized into a voice signal and output from the phone microphone.

Systems used for IQ modulation and IQ demodulation are known to those skilled in the art and, therefore, modulator 64 and demodulator 68 are not described in detail. For example, on IQ modulator is a HPMX-2003 manufactured by Hewlett Packard, and the IQ demodulator is a W2005 manufactured by AT&T.

Software in the CPU 39 both generates the I and Q signals for both analog and digital voice signals transmitted from modulator 64 and receive the analog and digital I and Q signals from the demodulator 68. The software that processes either analog or digital I and Q signals in the CPU is written by Pacific Communication Sciences, Inc. (PCSI), 10075 Barnes Canyon Road, San Diego, Calif. 92121, Part. No. 6IC-20-0028 and is, therefore, not described in detail.

The separate components and means for performing each separate task involved with modulating and demodulating both analog and digital voice data are known. However, using a single modulator circuit for transmitting both analog and digital formatted voice data from I and Q signals received over the same input ports is novel.

Correspondingly, the invention is novel by using the same IQ demodulator 68 for receiving and processing both analog and digital voice data from the same input port and generating demodulated analog and digital I and Q data from the same I and Q output ports. Thus, the dual mode phone circuitry is simpler, smaller and less inexpensive to manufacture than prior dual mode phones.

Figure 3:
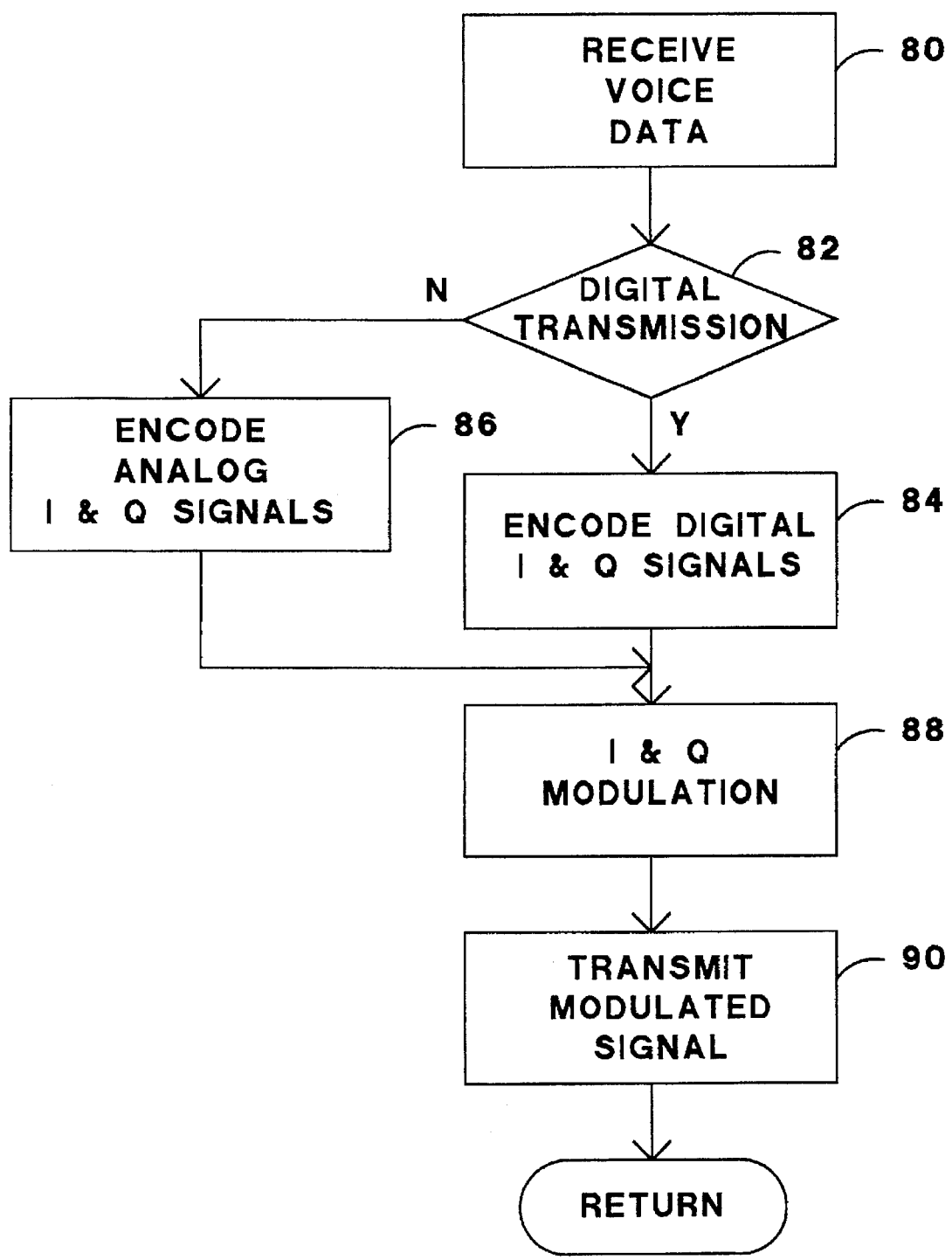
FIG. 3 is a flow diagram showing a method for transmitting analog and digital voice data in the system shown in FIG. 2.

FIG. 3 shows the basic method for modulating and demodulating analog and digital signals according to the system shown in FIG. 2. The CPU 39 receives voice data from a microphone in step 80. Decision step 82 determines whether the voice data is to be encoded digitally or in analog form. For digital transmission, step 84 encodes the data into a digital format and then translates the digital data into I and Q signals. The I and Q signals are modulated onto a carrier signal in step 88 and then transmitted as an RF signal from antenna 66 (FIG. 2) in step 90.

Alternatively, for analog transmissions, the CPU 39 encodes the voice data into analog I and Q signals in step 86. The I and Q signals are then modulated onto a carrier signal in step 88 and transmitted as an RF signal from antenna 66 in step 90.

Figure 4:
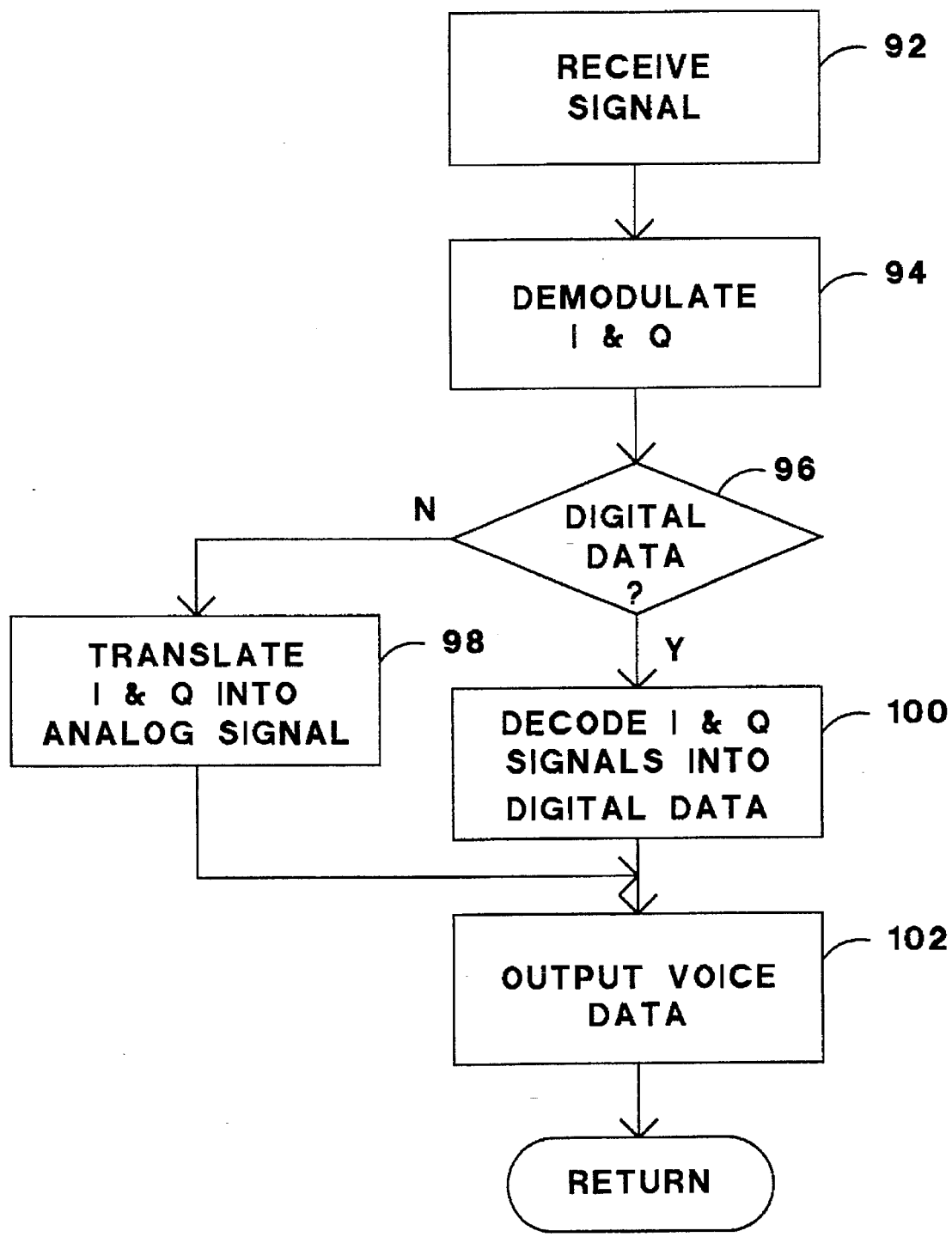
FIG. 4 is a flow diagram showing a method for receiving analog and digital voice data in the system shown in FIG. 2.

Referring to FIG. 4, FM digital and analog communication signals are received by antenna 66 in step 92. The voice data is demodulated and decoded into I and Q signals in step 94. The I and Q signals are demodulated in exactly the same manner for both analog and digital data. The CPU determines whether the data is digital or analog in decision step 96 according to a message from the cellular base station.

For digital message data, step 100 translates the I and Q signals into a digital data stream which is then further decoded by the CPU. The digital data is then output as voice signals through the phone speaker (not shown). For analog signals, the I and Q signals are translated by the CPU into an analog signal in step 98 and output as voice data from the phone speaker in step 102. Again, the method for translating I and Q signals into either analog and digital is shown in the IS-54B telecommunication standard and are, therefore, not described in detail.

Referring back to FIG. 2, the automatic frequency control signal 78 is coupled between the ADI 44 and a temperature controlled crystal oscillator 79. The crystal oscillator 79 sets the frequency of all synthesizers used for mixing up and down the RF signals from antenna 66.

Power Amplifier Efficiency Switch

Power amplifiers (PA's) are used to increase the gain of an output signal before being transmitted from an antenna. FM analog phones typically use a class-C PA that outputs power proportionally to the signal level of the input RF signal. For example, the PA output power is less when a smaller RF signal is supplied to the PA. Typically, the PA gate bias value remains at a constant value regardless of the PA output power level.

In one example, the PA 116 nominally consumes 210 milliamps (mA) of drain current at the highest power output level. Thus, when operating at 6 volts, the PA is dissipating 1.2 watts of power. However, at closer distances to the cellular base station 65 (FIG. 2), the PA may only need to generate 20 milliwatts of power to the antenna 66. Thus, in many instances the PA does not need to dissipate as much power as the maximum output power required. Accordingly, another aspect of the invention controls the PA gate bias voltage in coordination with the required phone transmission power level to increase energy efficiency and extend battery life.

Figure 5:
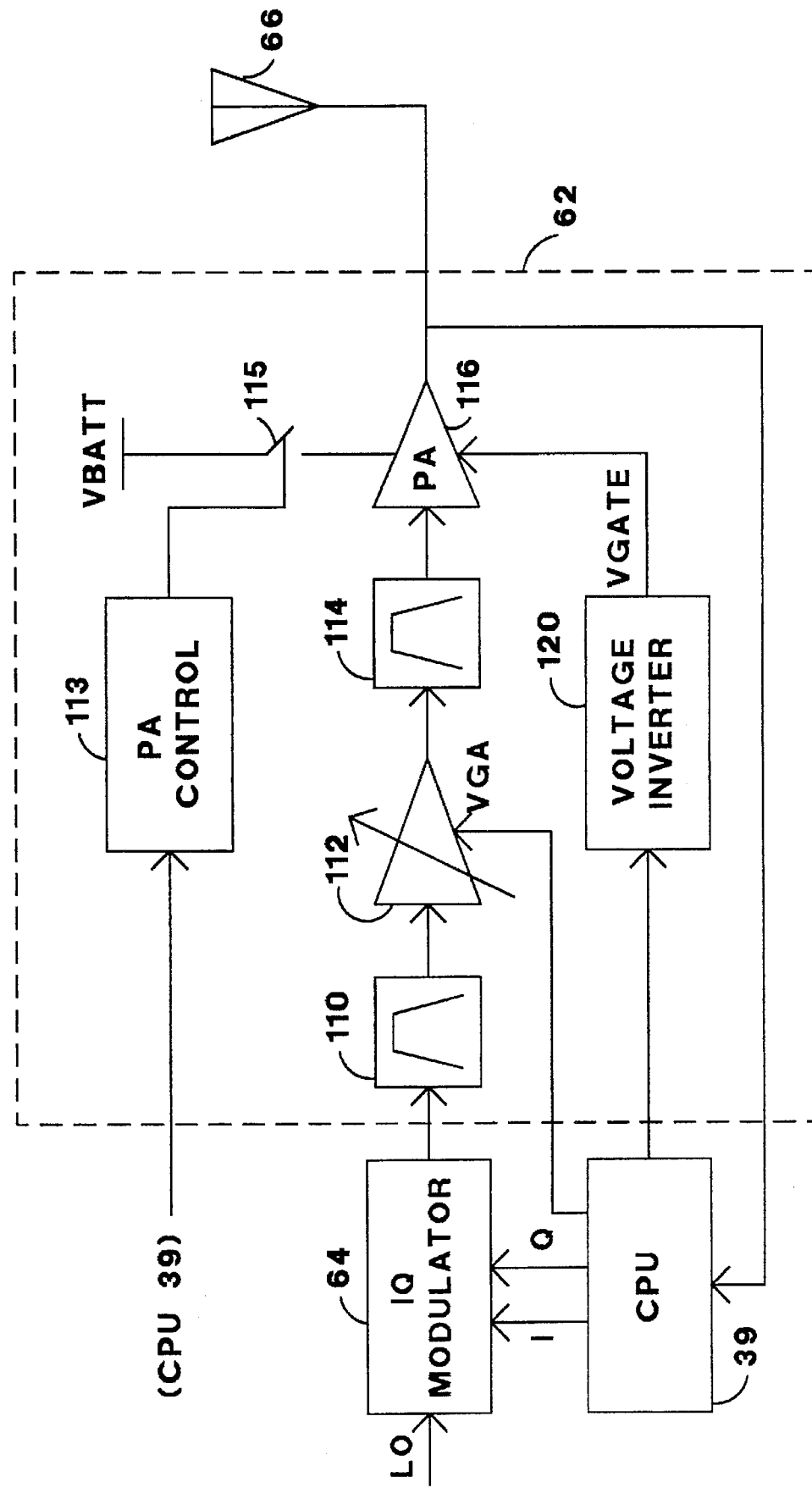
FIG. 5 is a detailed schematic diagram showing the transmitter circuitry for the dual mode phone shown in FIG. 2.

FIG. 5 is a detailed schematic diagram of the front end circuitry 62 for the transmitter previously shown in FIG. 2. The output from the IQ modulator 64 is passed through a filter 110 and a variable gain amplifier (VGA) 112. The amplified output signal is then passed through a second filter 114 before finally being passed through a power amplifier (PA) 116. The PA 116 receives a gate control voltage (Vgate) from the CPU 39 via a voltage inverter circuit 120. The output power level of the PA 116 is fed back to the CPU 39, via an analog-to-digital conversion circuit between PA 116 and CPU 39, creating a gain feedback loop. A PA control circuit 113 is coupled between CPU 39 via a switch 115 to the PA 116.

Figure 6:
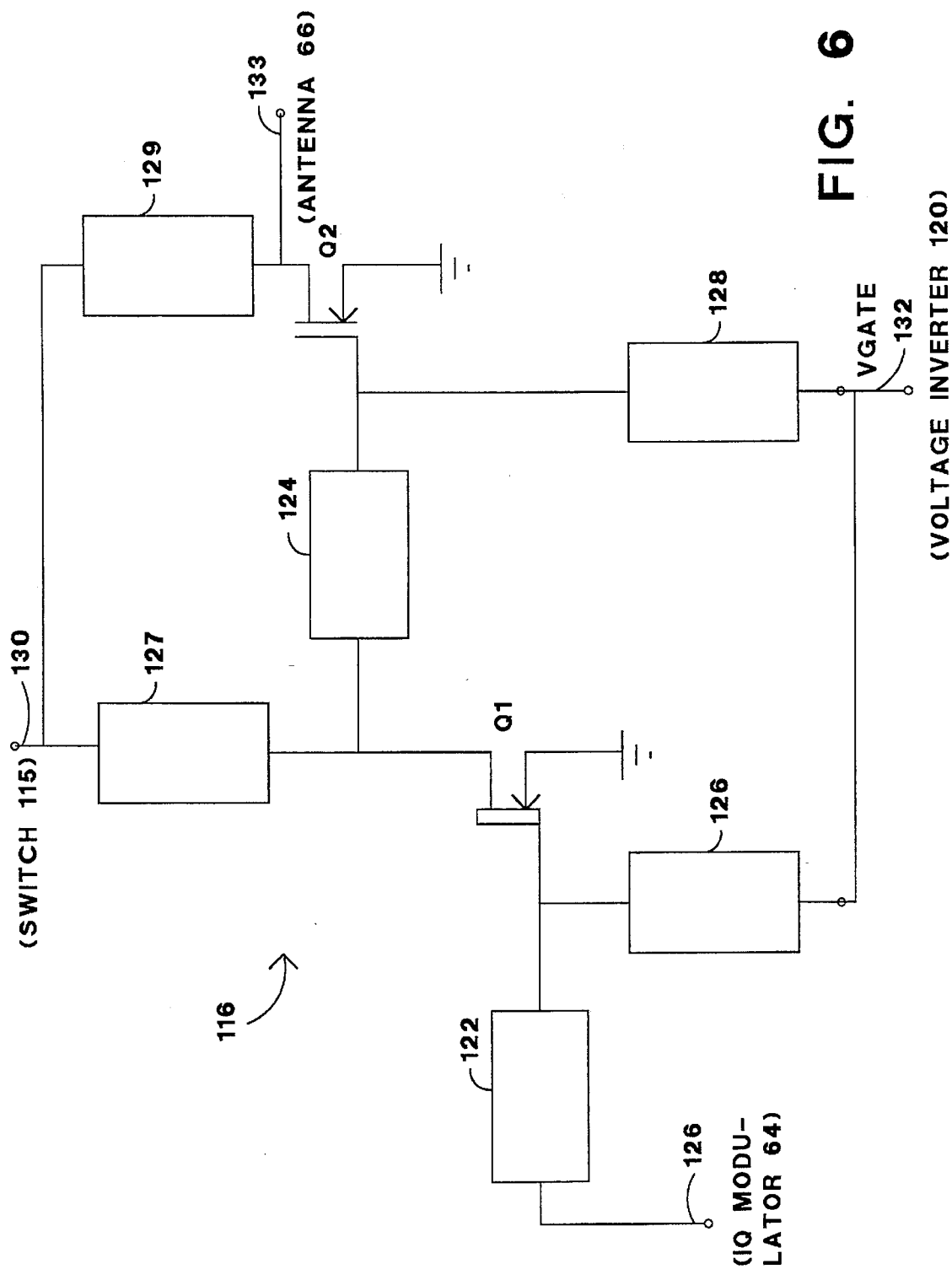
FIG. 6 is a detailed circuit diagram of a power amplifier shown in FIG. 5.

Referring to FIG. 6, the PA 116 comprises first and second gallium arsenide field effect transistors (GaAs FET's) Q1 and Q2, respectively. The modulated signal (RF signal) is applied at input terminal 126 and the Vgate voltage from voltage inverter 120 (FIG. 5) is applied to gate terminal 132. The drain terminals of Q1 and Q2 are coupled together at terminal 130 and are coupled through switch 115 (FIG. 5) to a power supply as will be described in detail below.

A matching network 122 is coupled between terminal 126 and the gate of transistor Q1 and a similar matching circuit 124 is coupled between the drain of Q1 and the gate of Q2. Bias networks 126–129 are coupled between bias terminal 132 and the gates of Q1 and Q2 and between terminal 130 and the drains of Q1 and Q2. The output terminal 133 of the PA is coupled to antenna 66 (FIG. 5).

Referring to both FIGS. 5 and 6, the voltage level of Vgate varies the DC bias level at the gate of Q1 and Q2, in turn, regulating the amount of drain current Q1 and Q2 consume and correspondingly, the amount of RF energy supplied at terminal 133. For example, at low output power levels, the Vgate voltage is increased to reduce power dissipation in the PA. However, at high output power levels, the voltage of Vgate is decreased to increase the output power level. Thus, the value of Vgate is varied according to the required output power level to increase PA energy efficiency.

The necessary Vgate voltage is determined by the CPU 39 according to the required power level at which the phone is required to transmit either analog or digital signals. The CPU 39 generates a Vgate value that is converted into an analog signal by a digital-to-analog converter (not shown) and then fed into the voltage inverter circuit 120. The output of voltage inverter 120 is then applied to the gate terminal 132 in PA 116. Accordingly, the Vgate voltage turns on Q1 and Q2 to an appropriate power level for providing the required output power level for the RF transmission.

The VGA 112 and the output of PA 116 are coupled together in a digital gain control loop via the CPU 39. Thus, as Vgate is varied according to the output power level, the gain of VGA 112 is adjusted to provide the required output signal level to PA 116.

There are six possible transmission power levels in the analog mode and nine possible transmission power levels in the digital mode. The required transmission power levels vary according to the physical distance of the mobile phone from a cellular base station. For example, when the dual mode phone moves physically closer to a cellular base station, less transmission power is required. At further distances from the base station, more transmission power is needed. Accordingly, the phone is notified by the cellular base station when to raise or lower the transmission power level. The base station sends a signal strength transmission message as specified in the IS-54B standard.

Figure 7:
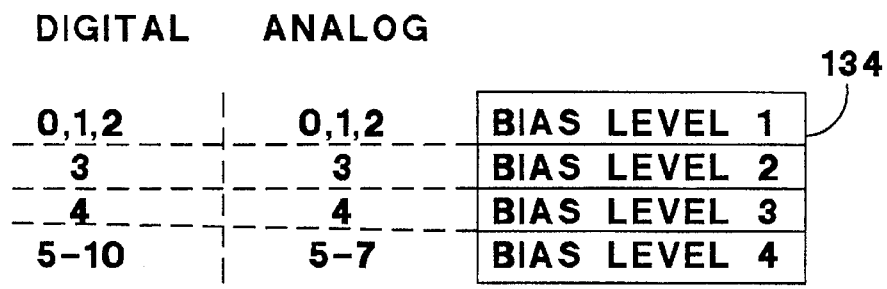
FIG. 7 is a table of bias level values stored in the central processing unit of the system shown in FIG. 2.

FIG. 7 shows a table 134 that contains the different PA bias levels assigned to output power levels for both digital and analog transmissions. Specifically, power levels 0–2 for both analog and digital transmissions are grouped in a first PA bias level value, power levels 3 and 4 are assigned to a second and third PA bias level, respectively. Power levels 5–7 in analog mode and power levels 5–10 in digital mode are assigned to a fourth PA bias level.

The first bias level turns the PA 116 completely on and is, therefore, used to provide the highest output power level. For example, output power levels 0,1, and 2 are used when the phone is located at a far distance from a cellular base station. Alternatively, power levels of five and above, represent low output power levels that have an associated PA bias level that comes close to shutting off the PA 116. Bias level 4 is used when the phone is in relatively close proximity to a cellular base station. If the dual mode phone is not transmitting, the CPU 39 generates a Vgate value that completely turns off PA 116.

Figure 8:
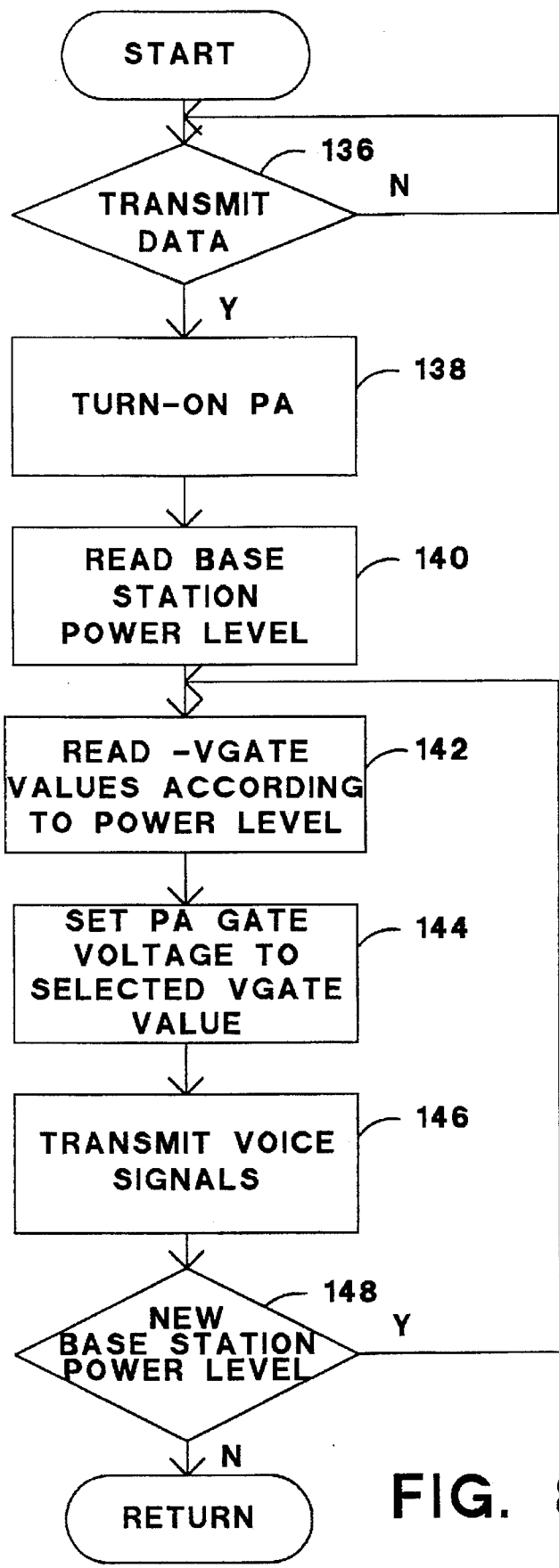
FIG. 8 is a flow diagram showing a method for varying the bias value for the power amplifier shown in FIG. 5 according to the phone's output and power level.

FIG. 8 is a flow diagram showing the method for varying the bias level of the PA 116 according to variable output power levels. Step 136 checks for transmission of either analog or digital data. Prior to a data transmission, the PA is turned on in step 138. The CPU 39 then reads the required power level transmitted from the cellular base station in step 140.

The CPU in step 142 reads table 134 (FIG. 7) to determine the correct Vgate bias level for the present output power level. The voltage level of Vgate is then set to the appropriate value stored in table 134. The bias level and associated drain current for the PA 116 is then reduced accordingly. The voice data is then transmitted at the selected power level in step 146.

Step 148 constantly polls the base station for new output power transmission requirements. If the base station sends the phone a new power level, the CPU jumps back to step 142 where the associated Vgate value is determined and applied to the PA. For example, as the phone moves closer to a cellular base station, the required output power level will decrease. Thus, the CPU accordingly varies the necessary PA bias voltage according to the phone's geographical proximity to the base station.

Power Amplifier Output Control

When the PA 116 is quickly turned on and off, energy interference known as "spectral splatter" is generated in the RF signal. This spectral splatter interferes with messages from other transmitters in adjacent baseband frequencies. The PA power supply current is varied in combination with the modulated I and Q signals to provide a smooth ramp-up and ramp-down in the RF signal at the PA output. The controlled ramp-up and ramp-down of the PA meets the cellular phone IS-54B transmission standards without using complicated circuitry.

Figure 9:
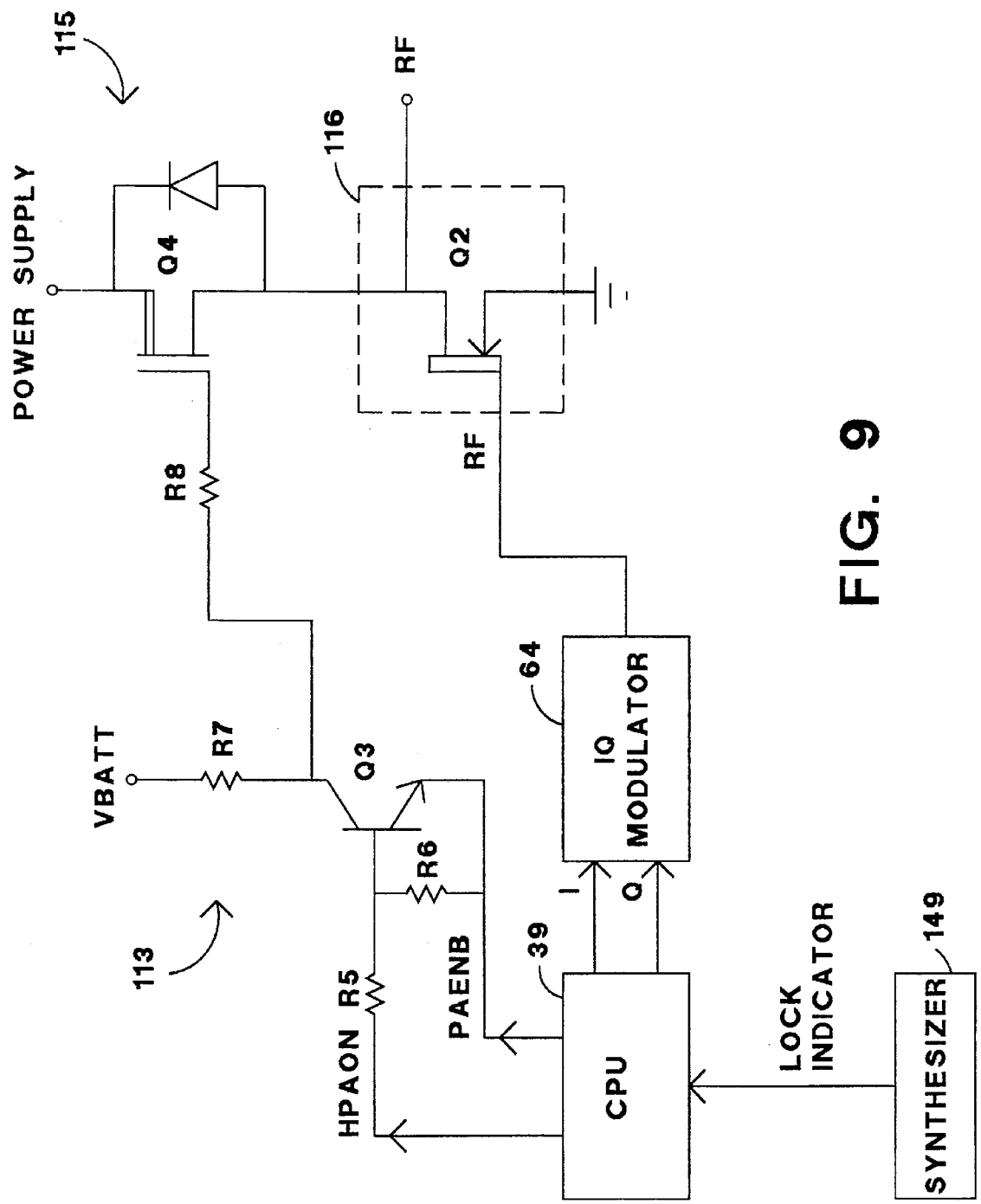
FIG. 9 is a detailed schematic diagram of a PA control circuit shown in FIG. 5.

FIG. 9 is a detailed circuit diagram of the PA control circuit 113, switch 115, and the PA 116 shown in FIG. 5. The PA control circuit 113 comprises a bipolar transistor Q3 that receives a "transmit on" signal HPAON at the base terminal and a PA enable signal PAENB at the emitter terminal. A transistor Q4 receives the output signal from transistor Q3 via a resistor R8 and is further coupled between a power supply and PA 116.

The PAENB signal is activated according to a lock indicator signal from a frequency synthesizer 149 via the CPU 39. The lock indicator signal is activated whenever the synthesizer frequency is outside a predetermined operating frequency. The HPAON signal is activated by the CPU 39 whenever data is transmitted.

From the time a message transmission process begins, there are approximately 120 microseconds (μsec) to bring the power in the PA 116 up to the correct transmission level. To prevent spectral splatter, the RF signal output from PA 116 is gradually raped up and down.

The PA control circuit 113 controls the rate in which the PA 116 powers up and powers down. If the HPAON and PAENB signals are activated, transistor Q1 turns on activating Q4. The series resistance R8 works in combination with the internal capacitance of Q4 providing an exponentially increasing power supply current to PA 116. Correspondingly, when the output from IQ modulator 64 is shut-off, the PA circuit 113 exponentially decreases power supply current to PA 116, in turn, slowly ramps down the RF output signal.

Figure 10:
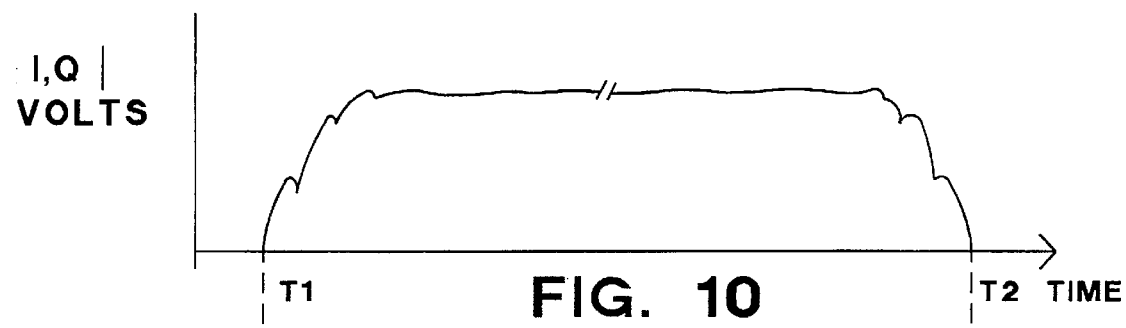
FIG. 10 is a graph showing amplitudes of I and Q signals prior to being input into the power amplifier according to a R-C circuit shown in FIG. 9.
Figure 11:
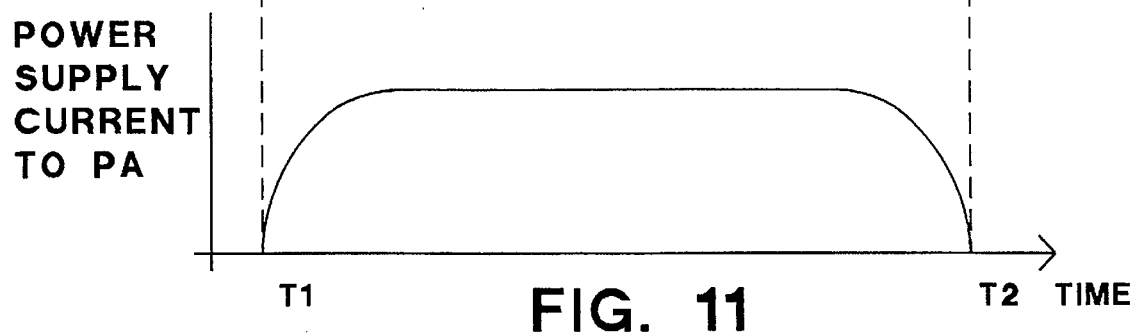
FIG. 11 is a graph showing the power supply current supplied to the power amplifier according to the PA control circuit shown in FIG. 9.

FIG. 10 shows the magnitude of the I and Q signals after passing though PA 116. The modulated signals slowly ramp up at the beginning of the transmission cycle at time $t_1$ and slowly ramp down at the end of the transmission cycle at time $t_2$. FIG. 11 shows the gradual ramp up and ramp down of power supply current to the PA 116. This gradual increase in supply current further prevents sharp instantaneous surges of power from the PA.

If the PAENB signal from the synthesizer 149 is disabled, the PA will not turn on. As described above, the lock indicator signal is activated, in turn, activating the PAENB signal, only when the operating frequency of the synthesizer is operating at a given frequency. Thus, if the synthesizer frequency is out of tolerance, transistor Q3 shuts off disabling the PA. Thus, PA control circuit 113 (FIG. 9) prevents spurious data transmissions when the phone frequency synthesizer is outside the required frequency range.

Front End Automatic Gain Control

Figure 12:
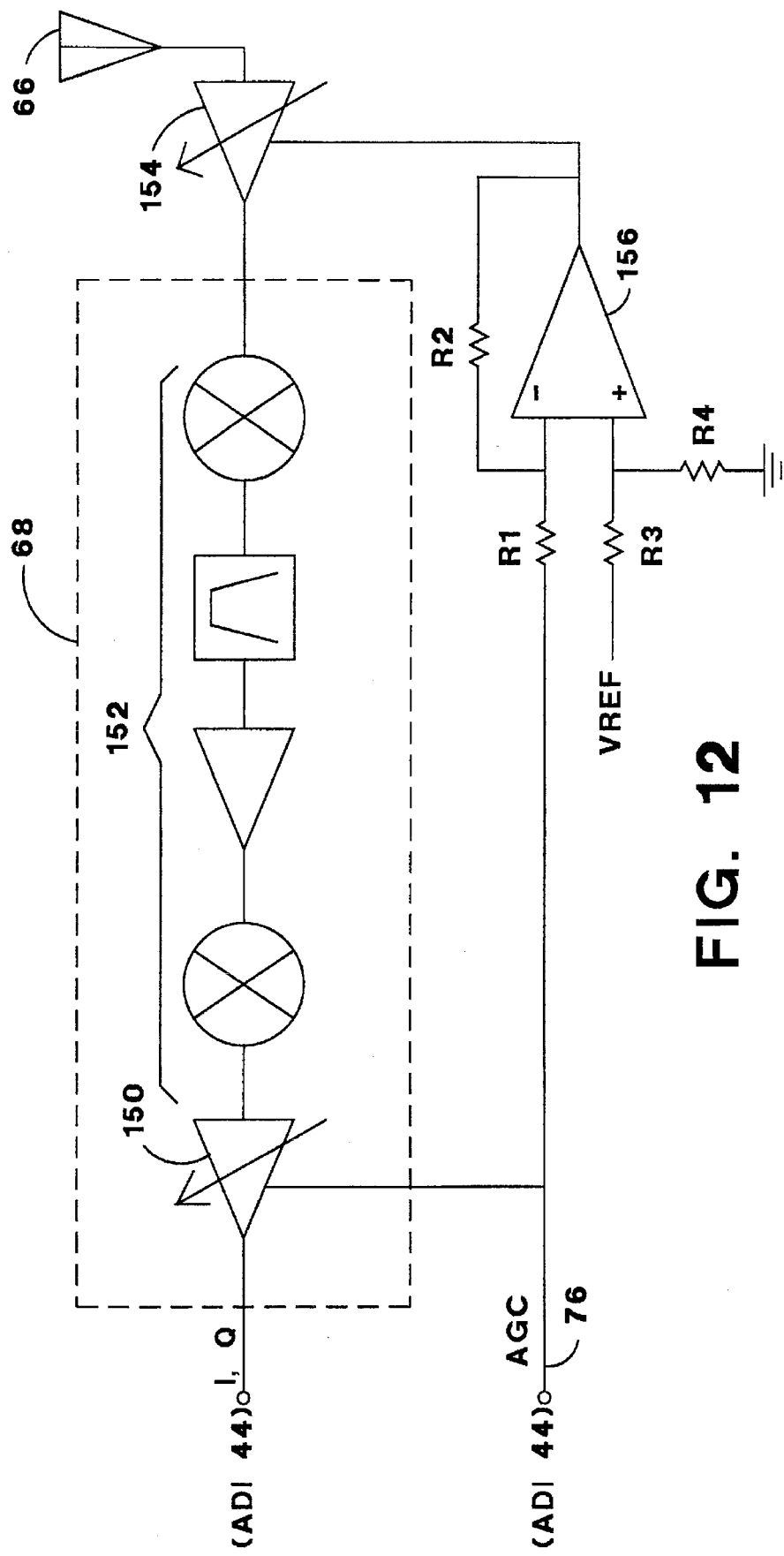
FIG. 12 is a detailed schematic diagram of an AGC control circuit contained within the receiver circuit shown in FIG. 2.

FIG. 12 is a detailed schematic diagram of a portion of the receiver circuitry 67 previously shown in FIG. 2. The IQ demodulator 68 is shown in dashed line 68 and includes a variable gain amplifier 150 and various mixer and filter circuitry 152. As described above, the signal processing performed in the demodulator 68, in general, is known by those skilled in the art and is, therefore, not described in detail.

If the RF signal received from antenna 66 is limited or clipped in demodulator 68, distortion is created in the voice signal. If the amplitude of the signals from the demodulator are too large, the I and Q signals will be clipped inside ADI 44 (FIG. 2) and again cause distortion and corresponding noise in the voice data. Thus the ADI 44 monitors the magnitude of the I and Q signals and accordingly varies the value of AGC signal 76. The AGC signal 76, in turn, adjusts the gain of operational amplifier 150 so that the I and Q signal are maintained within a given operating range.

For example, if the amplitude of I and Q begin to rise above or below a given voltage operating range, ADI 44 varies the voltage level of AGC 78. The AGC voltage, in turn, scales both the gain of the I and Q signals back within the correct operating range. Thus, the ADI 44 and variable gain amplifier 150 operate as a feedback loop to maintain a correct stable signal gain for the demodulated I and Q signals.

The gain of variable gain amplifier 150, however, does not have sufficient dynamic range as required by the dual mode phone. For example, the gain of variable gain amplifier 150 can vary between 10–80 decibels (db) for a full range of approximately 70 db. However, the gain of the I and Q signals must be varied across a range of approximately 100 db.

To increase the dynamic range of the receive chain defined as the receiver circuitry from antenna 66 through demodulator 68, a second variable gain amplifier 154 is coupled to the front end of demodulator 68. However, if amplifier 154 were simply turned on at some point at either the upper or lower range of the amplifier 150, a sharp transition would occur in the amplitude of the I and Q signals.

Figure 13:
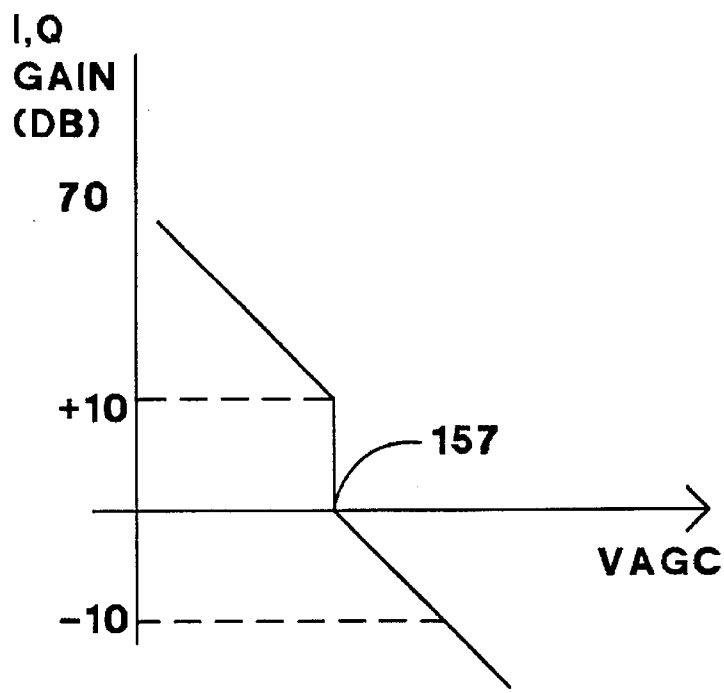
FIG. 13 is a graph showing the gain response for a prior art dual stage amplifier receiver.

FIG. 13 shows the gain for the I and Q signals with a dual stage amplifier system with the initial signal gain controlled by variable gain amplifier 150. As the I and Q signals are attenuated, variable gain amplifier 150 reaches a lower limit of 10 db at point 157. If the second amplifier 154 is simply turned on, the signal gain immediately drops to 0 db. The amplifier 154 then further attenuates the signal gain to the required value. The sharp gain transition at point 157 creates oscillation in the gain feedback loop inducing noise.

Operational amplifier (op-amp) 156 (FIG. 12) provides a smooth continuous transition in the overall signal gain eliminating stability problems created by a dual stage amplifier system. Op-amp 156 is coupled between the AGC signal and the second variable gain amplifier 154. Op-amp 156 receives a reference voltage Vref at the positive input terminal and the AGC signal at the inverting input terminal.

Vref is selected to correspond with the AGC voltage where variable gain amplifier 150 reaches a minimum gain value (e.g., 10 db). When the AGC voltage drops below the Vref voltage value, op-amp 156 provides a scaled output voltage that slowly turns on amplifier 154. Amplifier 154 then attenuates the RF signal input into demodulator 68 further attenuating the overall gain of I and Q. Resistors R1–R4 scale the voltage at the output of op-amp 156.

Figure 14:
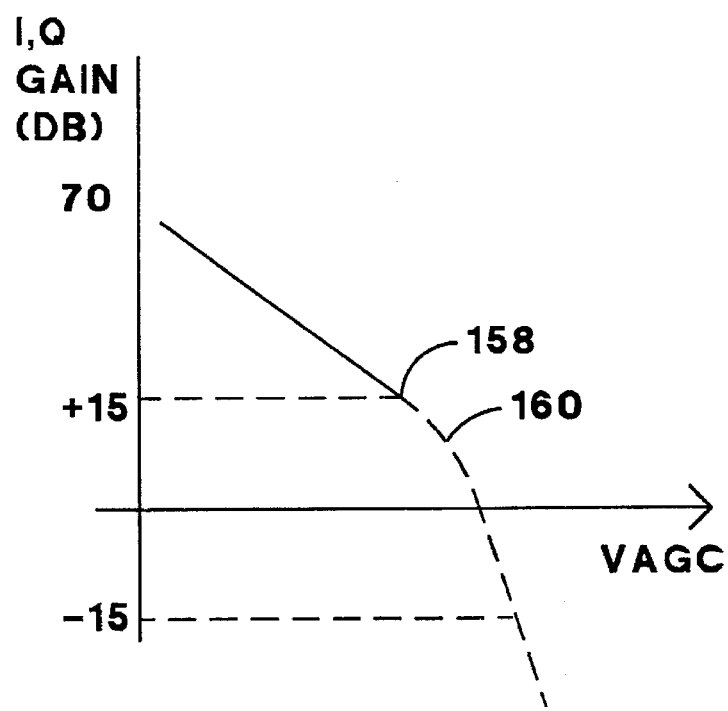
FIG. 14 is a graph showing an extended dynamic range gain for the receiver circuit shown in FIG. 12.

Referring to FIG. 14, the op-amp 156 turns on amplifier 154 at a selected point 158 in the AGC voltage. The dashed line 160 shows the remaining portion of the signal gain effected by amplifier 154. At a selected further attenuation value (e.g., 10 db), variable gain amplifier 150 reaches a lower gain limit. At this point, amplifier 154 provides all additional attenuation for the RF signal. Thus, op-amp 156 in combination with amplifier 154 provide a smooth continuous gain curve with increased overall dynamic range.

Switching Power Supply

A given amount of energy is consumed by the power amplifier 116 even while operating in a standby state. Present mobile phone battery supplies are constantly coupled to the power amplifier. Thus, the PA constantly drains energy from the battery even when the PA is not in use, for example, during receive modes.

Further, a large portion of the circuitry in a mobile phone can operate at a supply voltage (e.g., 3.6 V) lower than that required to operate the PA (e.g., 6.6 V). Because present resent mobile phones only use a single power supply voltage, the power supply must be set to the highest required power supply voltage (e.g., 6.6 V). However, low voltage IC's use more power when operating at higher voltage levels. Thus, present power supplies are inefficient at reducing battery operating life.

Figure 15:
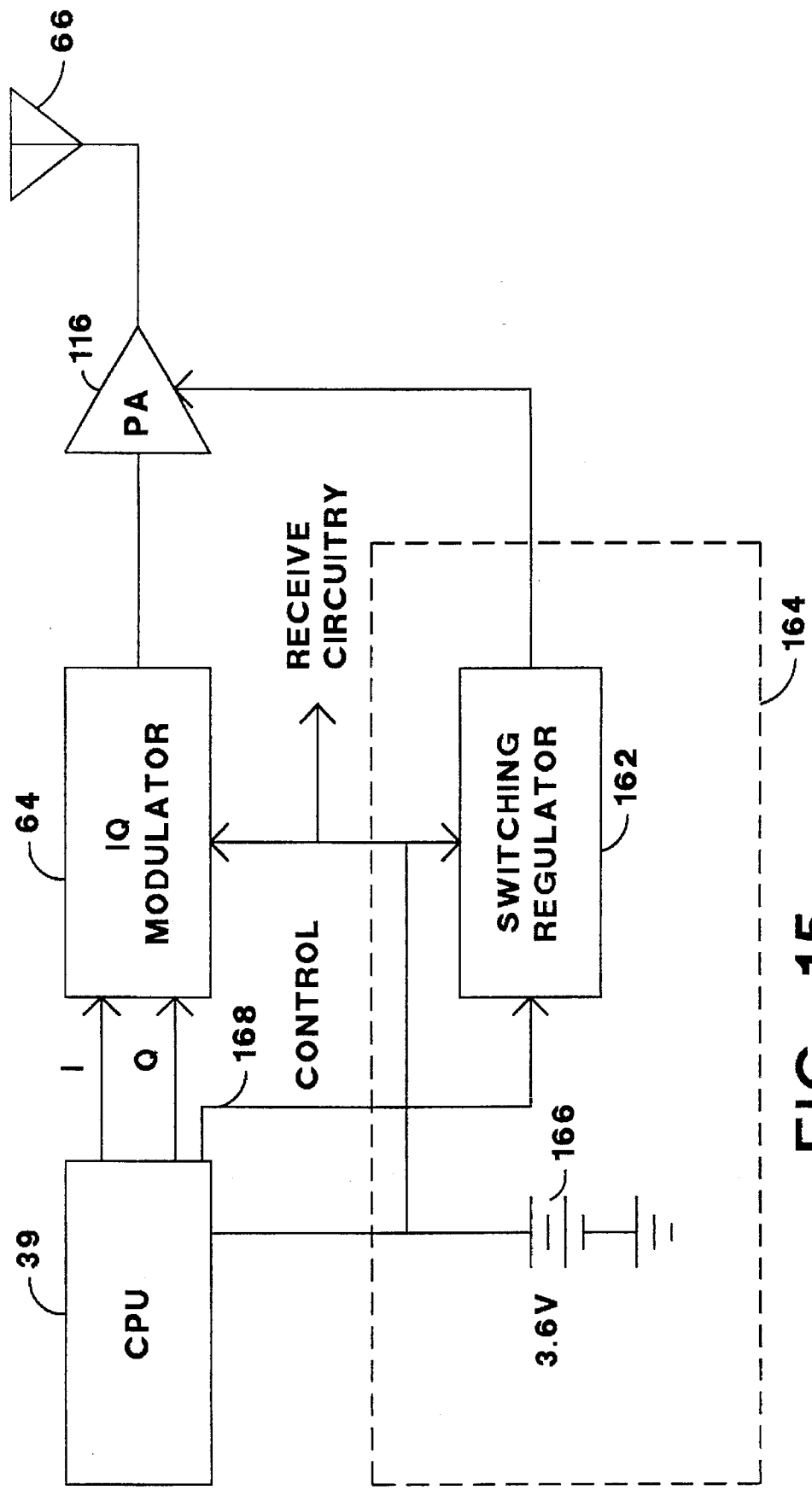
FIG. 15 is a schematic diagram of a cellular phone switching power supply according to another embodiment of the invention.

FIG. 15 is a schematic diagram of a switching power supply according to another embodiment of the invention. The CPU 39, IQ modulator 64, PA 116 and antenna 66 are similar to those shown in FIG. 5. A dual mode battery supply 164 includes a switching regulator 162 coupled to a DC battery 166. The battery 166 is coupled to the CPU 39, the IQ demodulator circuitry 64, the receiver circuitry (FIGS. 2, 5), and any other circuitry requiring a 3.6 volt power supply. A control signal 168 is coupled between the CPU 39 and the switching regulator 162 and an output of the switching regulator is coupled to the power amplifier 116. The switching regulator is manufactured by Linear Tec. Model No. 760 and is known to those skilled in the art an is, therefore, not described in detail The switching regulator 162 generates a switchable 6.6 V output at the power supply terminal 130 of PA 116 (FIG. 6). The output of regulator 162 is also coupled to various synthesizer circuitry (not shown) and any other circuitry that operates from a power supply voltage greater than the 3.6 V. The switching regulator 162 enables and adjusts the 6.6 V output according to the transmit and receive mode of the phone. Thus, low voltage IC's can be operated at their maximum efficiency at the lower 3.6 V voltage level. In addition, IC's that only operate periodically (e.g., during transmit mode) are powered only when active. By disconnecting power to IC's when not in use, less standby current is needed to further increase energy efficiency.

By utilizing the switching regulator 162, fewer battery cells are needed to generate the battery supply voltage. For example, 5 AA batteries are required to provide a 6.0 V battery supply voltage. However, only 3 AA batteries are required to provide the 3.6 V voltage shown in FIG. 15. Because few battery cells are required, the phone is lighter and easier to carry.

Figure 16:
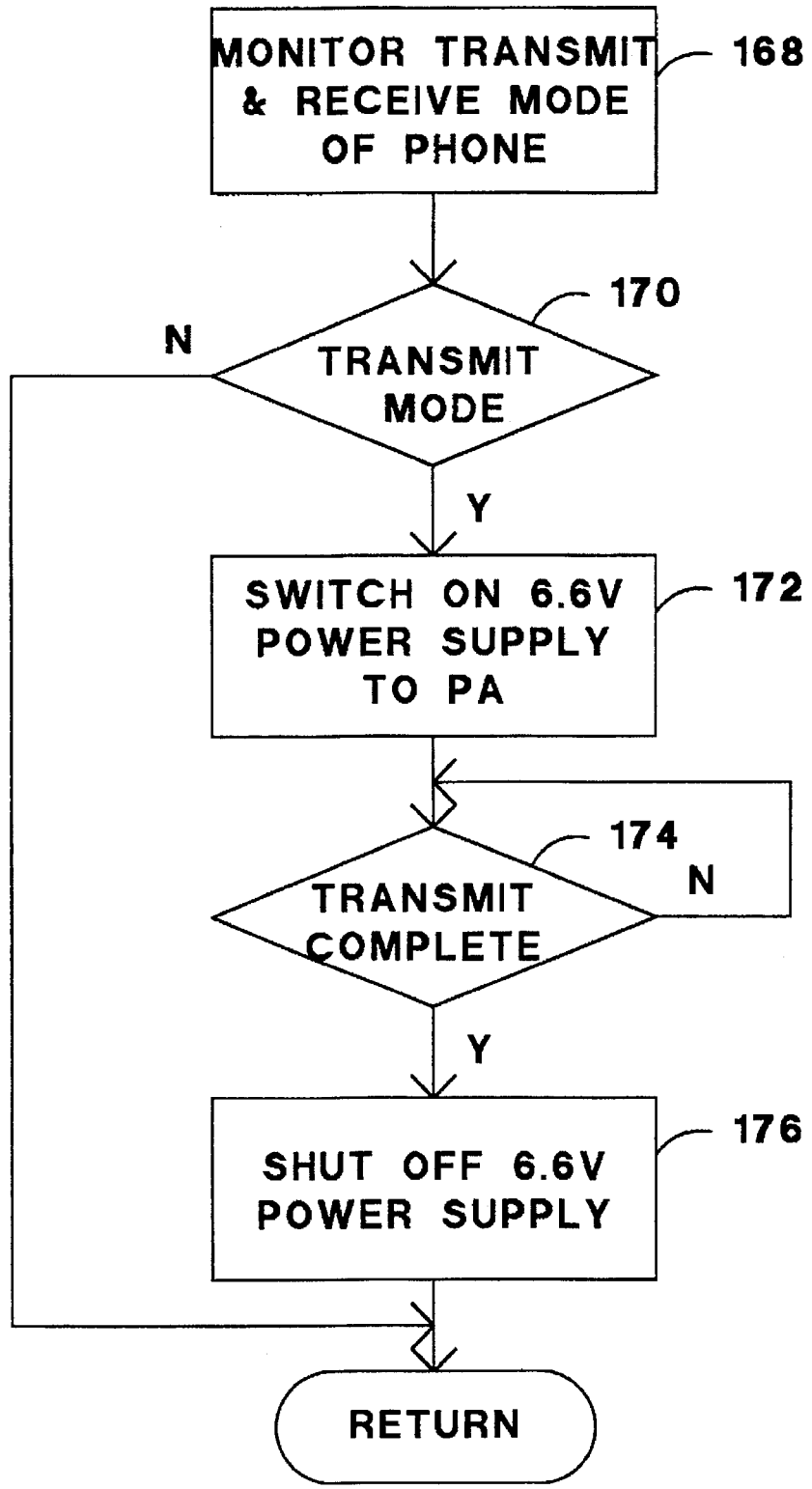
FIG. 16 is a flow diagram showing a method of operation of the switching power supply shown in FIG. 15.

FIG. 16 is a flow diagram showing the general method of operation of controls for the dual mode power supply. The CPU 39 (FIG. 15) monitors the phone for initiation of a transmit mode. For example, when buttons are pressed on the face of the phone, such as a send button, the CPU 39 generates an enable signal over line 168 (FIG. 15) to the switching regulator 162.

If a transmit mode is indicated, step 170 jumps to step 172 where the 6.6 V output from the switching regulator 162 is turned on. The PA 116, and other higher voltage circuitry requiring a supply voltage above 3.6 V, are then turned on and the phone sequence initiated. Step 174 monitors the control signal 168 for completion of the transmit sequence. When the transmit sequence is completed, the switching regulator 6.6 V output is disabled turning off the PA 116 in step 176. The dual mode battery supply 162 then waits for the next transmit sequence.

The dual mode battery supply 164 provides an intelligent power supply that both increases energy efficiently while reducing the overall weight of the battery cells.

The switching power supply can be used in conjunction with the other power amplifier control circuitry previously described above. For example, the switching power supply can be used in conjunction with the power amplifier output control circuitry that provides controlled amp up and ramp down of the RF signal. The switching power supply can also be used in conjunction with the power amplifier bias control circuit to further reduce energy consumption in the power amplifier. The specific combination of the transmission at low power levels switching power supply with the separate control circuits described above would be known to one skilled in the art and is, therefore, not shown in detail.

Having described and illustrated the principles of the invention in a preferred embodiment thereof, it should be apparent that the invention can be modified in arrangement and detail without departing from such principles. I claim all modifications and variation coming within the spirit and scope of the following claims.

The invention claimed is:

1. A dual mode analog and digital cellular phone, comprising:
    a central processing unit for converting back and forth between analog and digital voice data and I and Q signals;
    an IQ a modulator having an I and Q input terminal coupled to the central processing unit and an output terminal, the modulator receiving the I and Q signals for both the analog and digital voice data on the same I and Q input terminals and generating modulated output signals for the analog and digital signals on the same output terminal;
    an IQ a demodulator having an input for receiving both modulated analog and modulated digital voice data and I and Q output terminals coupled to the central processing unit for generating demodulated I and Q signals for both analog and digitally encoded voice data on the same I and Q output terminals signals;
    an amplifier for varying the gain of the demodulated I and Q signals within a given dynamic range comprising an upper and lower gain limit; and
    a power amplifier having an input coupled to the modulator output terminal, a bias voltage input operably coupled to the central processing unit and a power supply terminal.

2. A dual mode analog and digital cellular phone, comprising:
    a central processing unit for converting back and forth between analog and digital voice data and I and Q signals:
    an IQ modulator having an I and Q input terminal coupled to the central processing unit and an output terminal, the modulator receiving the I and Q signals for both the analog and digital voice data on the same I and Q input terminals and generating modulated output signals for the analog and digital signals on the same output terminal; and
    an IQ demodulator having an input for receiving both modulated analog and modulated digital voice data and I and Q output terminals coupled to the central processing unit for generating demodulated I and Q signals for both analog and digitally encoded voice data on the same I and Q output terminals, the demodulator including an amplifier for varying the gain of the demodulated I and Q signals within a given dynamic range comprising an upper and lower gain limit.

3. A dual mode phone according to claim 2 including means for extending the dynamic range of a receive chain while at the same time providing a smooth continuous gain transition from one of the upper and lower external limits of the demodulator dynamic range.

4. A dual mode phone according to claim 3 wherein the extension means comprise a linear variable gain amplifier having an output coupled to the input of the demodulator, a first input for receiving the modulated analog and modulated digital voice data and a second input, and an operational amplifier coupled between the central processing unit and the second input of the linear amplifier.

5. A dual mode phone according to claim 2 wherein the IQ modulator generates an FM modulated output signal having a frequency of approximately 800 MegaHertz.

6. A dual mode phone according to claim 2 wherein the IQ modulator includes a local oscillator input, a phase shifter and a first and second mixer, the first mixer coupled to the local oscillator input terminal and the I input and the second mixer coupled to the Q input terminal and coupled through the phase shifter to the local oscillator input.

7. A dual mode phone according to claim 6 wherein the IQ demodulator includes third and fourth mixers and a phase shifter, the third mixer including inputs for receiving second local oscillator input and the modulated analog and modulated digital voice data and having an output defining the demodulator I output terminal and the fourth mixer including inputs for receiving the output of the phase shifter and the modulated analog and modulated digital data and having an output defining the demodulator Q output terminal.

8. A dual mode analog and digital cellular phone, comprising:
    a central processing unit for converting back and forth between analog and digital voice data and I and Q signals;
    an IO modulator having an I and Q input terminal coupled to the central processing unit and an output terminal, the modulator receiving the I and Q signals for both the analog and digital voice data on the same I and Q input terminals and generating modulated output signals for the analog and digital signals on the same output terminal;
    an IQ demodulator having an input for receiving both modulated analog and modulated digital voice data and I and Q output terminals coupled to the central processing unit for generating demodulated I and Q signals for both analog and digitally encoded voice data on the same I and Q output terminals; and
    a temperature controlled crystal oscillator coupled between the demodulator and the central processing unit for generating a given reference frequency, the central processing unit further including means for automatically adjusting the given reference frequency of the oscillator.

9. A dual mode analog and digital cellular phone, comprising:
    a central processing unit for converting back and forth between analog and digital voice data and I and Q signals:
    an IQ modulator having an I and Q input terminal coupled to the central processing unit and an output terminal, the modulator receiving the I and Q signals for both the analog and digital voice data on the same I and Q input terminals and generating modulated output signals for the analog and digital signals on the same output terminal;
    an IQ demodulator having an input for receiving both modulated analog and modulated digital voice data and I and Q output terminals coupled to the central processing unit for generating demodulated I and Q signals for both analog and digitally encoded voice data on the same I and Q output terminals; and a power amplifier having an input coupled to the IQ modulator output, a bias voltage input operably coupled to the central processing unit and a power supply terminal.

10. A dual mode phone according to claim 9 including means for generating a bias control signal at the bias voltage input according to an output power level power amplifier.

11. A dual mode phone according to claim 10 wherein the bias generating means further comprise means for varying the bias control signal according to a set of prestored output power values, each output power value associated with a range of geographical distances from a cellular base station.

12. A dual mode phone according to claim 11 including means for controlling the rate at which power is supplied to the power supply terminal of the power amplifier.

13. A dual mode phone according to claim 12 wherein the power supply control means comprise a power supply transistor coupled between a power supply and the power amplifier, the transistor including a gate terminal for receiving a phone transmit signal from the central processing unit.

14. A dual mode phone according to claim 13 wherein the power amplifier comprises at least one field effect transistor having a drain terminal coupled to the power supply transistor and a gate terminal coupled to both the IQ modulator output and the bias generating means.

15. A dual mode phone according to claim 12 including means for ramping up and ramping down the modulated I and Q signals input to the power amplifier.

16. A dual mode phone according to claim 15 wherein the ramping means comprise a power amplifier control circuit coupled between the central processing unit and the power amplifier, the power amplifier control circuit exponentially increases and decreasing power to the power amplifier.

17. A cellular phone for transmitting and receiving analog and digital voice data to and from a cellular base station, comprising:

a central processing unit for processing both the analog and digital voice data;

a transmitter circuit for transmitting of both analog and digital voice data, the transmitter including an input coupled to the central processing unit and an output;

a receiver circuit including an input for receiving both analog and digital voice data and an output coupled to the central processing unit;

a power amplifier having an input coupled to the transmitter output and an output for supplying amplified voice data to an antenna for RF data transmission at a given output power level, the power amplifier including a bias voltage input terminal for receiving a given bias signal; and control means for changing the given bias signal according to proximity of the phone in relation to the cellular base station.

18. The cellular phone according to claim 17 wherein the power amplifier comprises at least one transistor having a gate terminal coupled to both the transmitter output and to the control means.

19. The cellular phone according to claim 18 wherein the central processing unit includes means for storing an array of predefined power amplifier bias voltage values, each bias voltage value associated with a power amplifier output power level required for transmitting voice data within a given geographical range of the cellular base station, the central processing unit sending the bias voltage values to the power amplifier according to a required output power level transmitted signal from the cellular base station.

20. The cellular phone according to claim 17 wherein the receiver includes a first amplifier for varying gain of the received voice data within a given dynamic range and a second amplifier for extending the dynamic range of the first amplifier while at the same time providing a smooth and continuous gain transition from the given dynamic range provided by the first amplifier.

21. A dual mode analog and digital cellular phone, comprising:

a central processing unit for processing both analog and digitally encoded voice data;

a transmitter circuit coupled to the central processing unit for transmitting FM output signals for both the analog and digital voice data;

a receiver circuit including an input for receiving modulated analog and digital voice data and an output for generating demodulated analog and digital voice data;

a variable gain amplifier coupled between the receiver circuit output and the central processing unit for varying the gain of the demodulated analog and digital voice data, the variable gain amplifier having a given dynamic range with an upper and lower gain limit; and means for extending the given dynamic range of the variable gain amplifier while at the same time providing a smooth continuous gain transition from and extending beyond at least one of the upper and lower gain limits.

22. A dual mode phone according to claim 21 wherein the extension means comprise a linear amplifier coupled to the input of the receiver and an operational amplifier coupled between the central processing unit and the linear amplifier, the operational amplifier further including means for scaling an automatic gain control signal supplied from the central processing unit according to at least one of the upper and lower gain limits of the variable gain amplifier dynamic range.

23. A dual mode analog and digital cellular phone, comprising:

a central processing unit for processing both analog and digital encoded voice data;

a modulator circuit coupled to the central processing unit for generating modulated output signals for wireless transmission of the analog and digital voice data;

a power amplifier having a first input coupled to the modulator, a second input operably coupled to a power supply for receiving a given power supply current, and an output, the power amplifier transmitting the modulated output signals for given transmission time periods; and means for ramping up the power supply current supplied to the second input terminal at a beginning of each given time period and exponentially ramping down the power supply current supplied to the second input terminal at an end of each given time period.

24. A dual mode phone according to claim 23 including means for exponentially ramping up the modulated output signals during the beginning of each given time period and exponentially ramping down the modulated output signals during the end of each given time period.

25. A dual mode phone according to claim 24 wherein the power supply ramping means comprise a switch coupled between said power supply and the second input of the power amplifier, the switch including a gate for receiving a transmit enable signal from the central processing unit.

26. A dual mode phone according to claim 25 including a frequency synthesizer having an output for indicating when the synthesizer is operating within a given frequency range and an enable transistor coupled between the synthesizer and the switch, the enable transistor turning on the switch according to the frequency synthesizer output.

27. A dual mode phone according to claim 24 wherein the means for ramping up and ramping down the modulated output signals comprise a resistor-capacitor circuit.

28. A method for transmitting and receiving both analog and digital voice data in a cellular phone, comprising:

translating analog and digital voice data into phase (I) and quadrature (Q) signals;

modulating the analog and digital I and Q signals with a common modulator circuit and transmitting the modulated I and Q signals to a cellular base station;

receiving analog and digital voice data from the cellular base station;

demodulating the analog and digital voice data into I and Q signals with a common demodulator circuit; and varying the gain of the demodulated I and Q signals within a given dynamic range having an upper and lower gain limit.

29. A method for transmitting and receiving both analog and digital voice data in a cellular phone, comprising:

translating analog and digital voice data into phase (I) and quadrature (Q) signals;

modulating the analog and digital I and Q signals with a common modulator circuit and transmitting the modulated I and Q signals to a cellular base station;

receiving analog and digital voice data from the cellular base station;

demodulating the analog and digital voice data into I and Q signals with a common demodulator circuit, wherein the demodulated I and Q signals for the analog voice data is decoded into an analog signal and output as a voice signal and the I and Q signals for the digital voice data is decoded into a digital data stream and then translated into a voice signal.

30. A method for transmitting and receiving both analog and digital voice data in a cellular phone, comprising:

translating analog and digital voice data into phase (I) and quadrature (Q) signals:

modulating the analog and digital I and Q signals with a common modulator circuit and transmitting the modulated I and Q signals to a cellular base station;

receiving analog and digital voice data from the cellular base station:

demodulating the analog and digital voice data into I and Q signals with a common demodulator circuit; and providing an amplifier for varying the gain of the demodulated I and Q signals within a given dynamic range having an upper and lower gain limit.

31. A method according to claim 30 including extending the dynamic range of the amplifier while at the same time providing a smooth continuous gain transition from one of the upper and lower external limits of the demodulator dynamic range.

32. A method for transmitting and receiving both analog and digital voice data in a cellular phone, comprising:

translating analog and digital voice data into phase (I) and quadrature (Q) signals;

modulating the analog and digital I and Q signals with a common modulator circuit and transmitting the modulated I and Q signals to a cellular base station;

receiving analog and digital voice data from the cellular base station;

demodulating the analog and digital voice data into I and Q signals with a common demodulator circuit, and providing a power amplifier for amplifying the modulated I and Q signals, the amplifier generating an output power level proportional to a given bias voltage and a given power supply current.

33. A method according to claim 32 including varying the bias voltage according to a set of predetermined output power levels, each output power value associated with a geographical distance from a cellular base station.

34. A method phone according to claim 33 including controlling the rate at which power from the power supply is supplied to the power amplifier according to transmission of modulated data from the power amplifier.

* * * * *